US005715199A

United States Patent [19]

Kim

[11] Patent Number: 5,715,199
[45] Date of Patent: Feb. 3, 1998

[54] BACK BIAS VOLTAGE GENERATING CIRCUIT

[75] Inventor: Hong Seok Kim, Kyoungki-do, Rep. of Korea

[73] Assignee: Hyundai Electronics Industries Co., Ltd., Rep. of Korea

[21] Appl. No.: 771,663

[22] Filed: Dec. 23, 1996

[51] Int. Cl.$^6$ .................................................. G11C 7/00
[52] U.S. Cl. ........................ 365/189.09; 365/189.11
[58] Field of Search ........................ 365/189.09, 189.11, 365/226

[56] References Cited

U.S. PATENT DOCUMENTS

| | | | |
|---|---|---|---|
| 4,964,082 | 10/1990 | Sato et al. | 365/189.09 |
| 5,434,820 | 7/1995 | Kim | 365/189.09 |
| 5,446,697 | 8/1995 | Yoo et al. | 365/189.09 |
| 5,499,217 | 3/1996 | Pascucci et al. | 365/189.11 |
| 5,563,831 | 10/1996 | Ting | 365/189.09 |
| 5,587,956 | 12/1996 | Tanida | 365/189.09 |

*Primary Examiner*—Son T. Dinh
*Attorney, Agent, or Firm*—Gary M. Nath; Nath & Associates

[57] ABSTRACT

A back bias voltage generating circuit of a semiconductor memory device which is capable of reducing noise generated during the operation of a circuit affecting the operation of a sense amplifier. The back bias voltage generating circuit includes: a back bias voltage oscillator which outputs a pulse signal having a constant period; a back bias voltage oscillator phase shifter which phase-shifts the pulse signal from the back bias voltage oscillator and outputs a plurality of phase-shifted pulse signals; a plurality of back bias voltage pump drivers which are driven by the plurality of phase-shifted pulse signals outputted from the back bias voltage oscillator phase shifter; a plurality of back bias voltage pumpers which generate a back bias voltage by control signals generated from the plurality of back bias voltage pump drivers; and a back bias voltage enable controller which inputs the back bias voltage and a sense amplifier enable signal for controlling the back bias voltage oscillator, to halt the back bias voltage pumpers, when a sense amplifier operates, but applies a signal detecting the back bias voltage to the back bias voltage oscillator, when the sense amplifier does not operate.

11 Claims, 6 Drawing Sheets

BACK BIAS VOLTAGE GENERATING CIRCUIT

BACKGROUND OF THE INVENTION

1. Field of the Invention

The present invention relates to a back bias voltage generating circuit of a semiconductor memory device, and more particularly, to a back bias voltage generating circuit which is capable of reducing noise generated during the operation of a circuit affecting the operation of a sense amplifier.

2. Description of the Prior Art

Generally, a back bias voltage generating circuit, which applies a back bias voltage (hereinafter, referred to as VBB) to a semiconductor well or substrate, maintains a junction surface of the semiconductor well or substrate with peripheral circuits at a reverse bias state. As a result, a malfunction of the peripheral circuits can be prevented and a bias state of a semiconductor device may be kept stable.

FIG. 1 is a block diagram illustrating a configuration of a conventional back bias voltage generating circuit. In the configuration, a VBB detector 11 detects a VBB, and a VBB oscillator 12 outputs a pulse signal having a constant period by the output of the VBB detector 11. A VBB oscillator predriver 13 is driven by the pulse signal having the predetermined period generated from the VBB oscillator 12. A plurality of VBB pump drivers 14_1~14_4 respectively output control signals for controlling a plurality of VBB pumpers 15_1~15_4 by the pulse signal outputted from the VBB oscillator predriver 13, and the plurality of VBB pumpers 15_1~15_4 produce the VBB by the control signals outputted from the plurality of VBB pump drivers 14_1~14_4.

However, the VBB oscillator 12 in the conventional back bias voltage generating circuit of FIG. 1 outputs the pulse signal having the same phase, and the plurality of VBB pumpers 15_1~15_4 are driven by the outputted pulse signal. Accordingly, when the VBB pumpers 15_1~15_4 and the VBB oscillator predriver 13 operate, noise having the same phase is generated on the semiconductor substrate and a ground voltage VBB line.

In the case of a semiconductor memory device which adopts a folded bit line fashion, the noises are offset to each other and therefore, the generated noise does not matter. However, in the case of a semiconductor memory device which adopts an open bit line fashion, when a sense amplifier senses data, the sense amplifier is absolutely under the effect of the offset voltage, so that the memory device becomes considerably sensitive to the noise generated from the back bias voltage generating circuit.

FIG. 2 is a graph illustrating a simulation result of noises waveforms generated from the back bias voltage generating circuit of FIG. 1. In this figure, a waveform "a" indicates an output waveform of the VBB oscillator 12, a waveform "b" represents a noise component produced in the ground voltage VBB of the memory device, a waveform "c" represents a noise component produced in the substrate in the case where the sense amplifier senses data, and a waveform "d" represents a waveform of a VBB direct current voltage level. As shown in FIG. 2, when the sense amplifier senses data, it can be appreciated that the sense amplifier is greatly affected by the noise components generated from the back bias voltage generating circuit.

For instance, in case where an N-type MOS transistor is arranged on a P-type substrate, the back bias voltage generating circuit disposed within a chip supplies the VBB to the substrate. Accordingly, noise occurs on the substrate during operation of the the back bias voltage generating circuit. Furthermore, in the case of a general dynamic random access memory, the sense amplifier is typically comprised of an N-type MOS transistor, so that a malfunction within memory device may be induced due to the noise from the back bias voltage generating circuit.

SUMMARY OF THE INVENTION

Accordingly, the present invention is directed to a back bias voltage generating circuit of a semiconductor memory device that substantially obviates one or more of the problems due to limitations and disadvantages of the related art.

An object of the invention is to provide a back bias voltage generating circuit of a semiconductor memory device which is capable of shifting a phase of a pulse signal serving to drive back bias voltage pumpers to thereby prevent noises from being superposed, so that a peak noise level generated from a power line and a substrate can be reduced.

Another object of the invention is to provide a back bias voltage generating circuit of a semiconductor memory device which is capable of halting an operation of the circuit using a sense amplifier enable signal when a sense amplifier senses data, so that noise generated on a substrate can receive a reduced influence on the operation of sense amplifier.

Still another object of the invention is to provide a back bias voltage generating circuit of a semiconductor memory device which is capable of offsetting noises generated during operation and noises generated on a power line and a substrate using an inversion signal of a pulse signal outputted from a ring oscillator, so that the generated noise can be considerably reduced.

In accordance with an aspect of the present invention, a back bias voltage generating circuit of a semiconductor memory device, includes: a back bias voltage oscillator which outputs a pulse signal having a constant period; a back bias voltage oscillator phase shifter which phase-shifts the pulse signal from the back bias voltage oscillator and outputs a plurality of phase-shifted pulse signals; a plurality of back bias voltage pump drivers which are driven by the plurality of phase-shifted pulse signals outputted from the back bias voltage oscillator phase shifter; a plurality of back bias voltage pumpers which generate a back bias voltage by control signals generated from the plurality of back bias voltage pump drivers; and a back bias voltage enable controller which inputs the back bias voltage and a sense amplifier enable signal, for controlling the back bias voltage oscillator to thereby halt the back bias voltage pumpers, when a sense amplifier operates, but applies a signal detecting the back bias voltage to the back bias voltage oscillator, when the sense amplifier does not operate.

In accordance with another aspect of the present invention, a back bias voltage generating circuit of a semiconductor memory device, includes: a back bias voltage detector which detects a back bias voltage; a back bias voltage oscillator which outputs a pulse signal having a constant period by the output of the back bias voltage detector; a back bias voltage enable controller which inputs a sense amplifier enable signal to thereby output a predetermined pulse signal; a back bias voltage oscillator phase shifter which is controlled by the pulse signal generated from the back bias voltage enable controller and phase-shifts the pulse signal from the back bias voltage oscillator to thereby output a plurality of phase-shifted pulse signals; a plurality of back bias voltage pump drivers which are driven by the plurality of phase-shifted pulse signals outputted from the back bias voltage oscillator phase shifter; and a plurality of back bias voltage pumpers which generate the back bias voltage by control signals generated from the plurality of back bias voltage pump drivers.

It is to be understood that both the foregoing general description and the following detailed description are exemplary and explanatory and are intended to provide further explanation of the invention as claimed.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1:
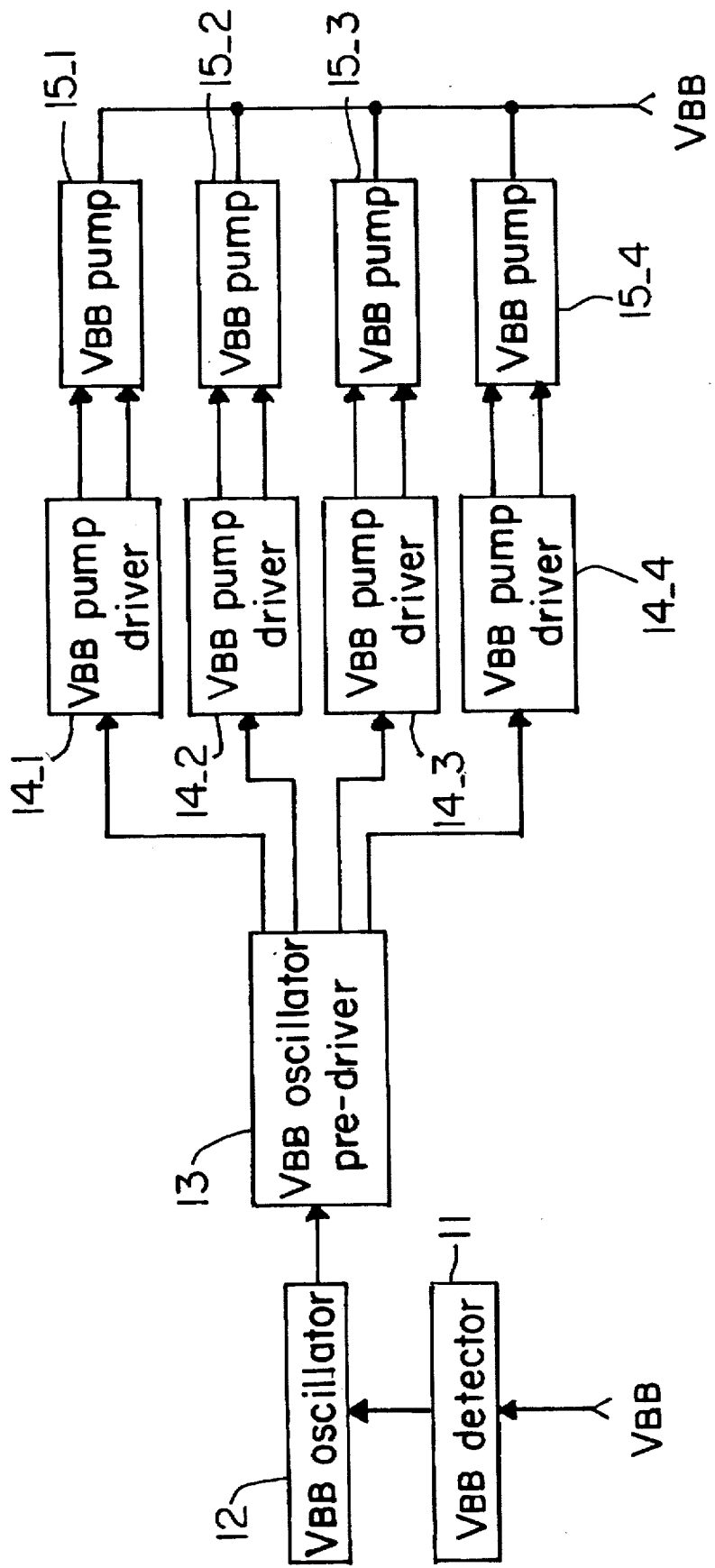
FIG. 1 is a block diagram illustrating a configuration of a conventional back bias voltage generating circuit.
Figure 2:
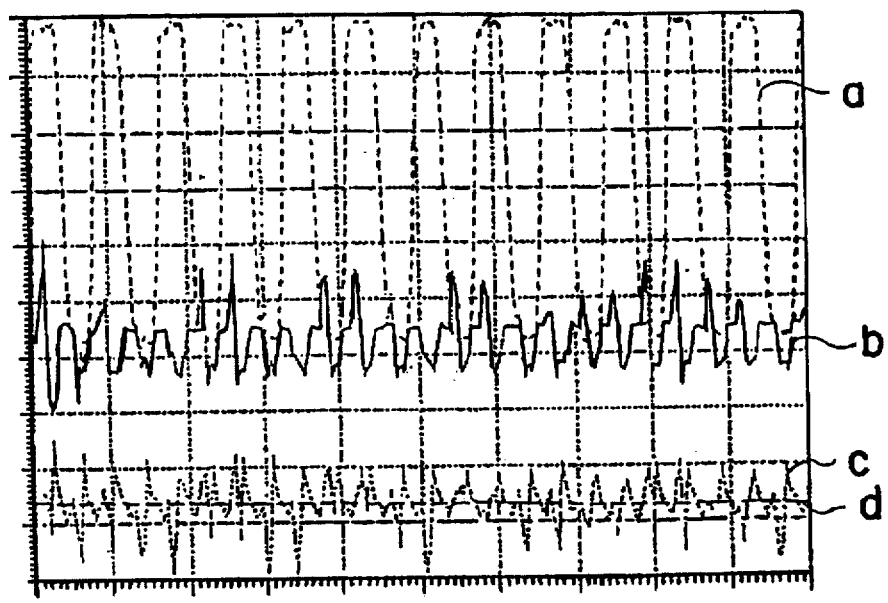
FIG. 2 is a graph illustrating a simulation result of noise waveforms generated from the back bias voltage generating circuit of FIG. 1.
Figure 3:
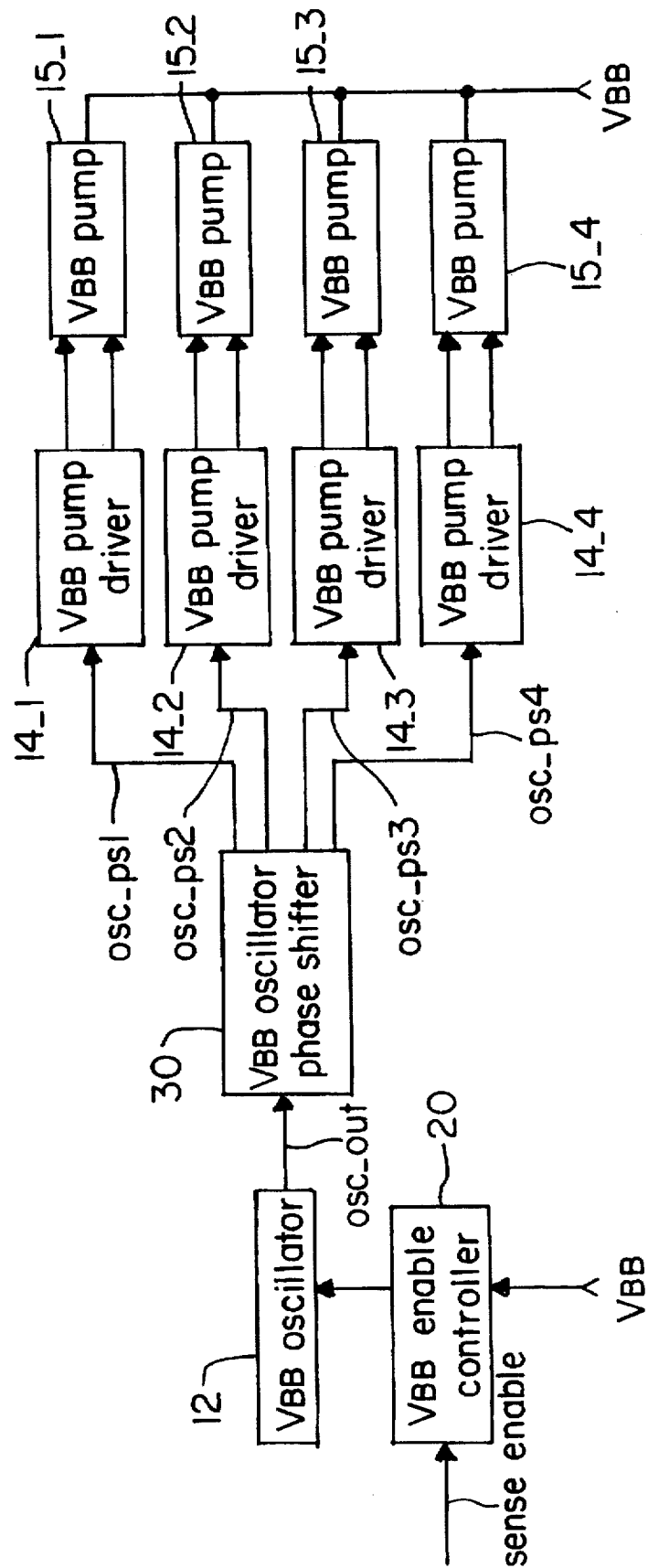
FIG. 3 is a block diagram illustrating a configuration of a back bias voltage generating circuit according to a first embodiment of the present invention.

Referring to FIG. 3, a back bias voltage generating circuit according to the present invention includes: a VBB oscillator 12 which outputs a pulse signal osc_out having a constant period; a VBB oscillator phase shifter 30 which phase-shifts the pulse signal osc_out from the VBB oscillator 12 and outputs a plurality of phase-shifted pulse signals osc_ps1~osc_ps4; a plurality of VBB pump drivers 14_1~14_4 which are each driven by the plurality of phase-shifted pulse signals osc_ps1~osc_ps4 outputted from the VBB oscillator phase shifter 30; a plurality of VBB pumpers 15_1~15_4 which generate a VBB by control signals generated from the plurality of back bias voltage pump drivers 14_1~14_4 and a VBB enable controller 20 which inputs the VBB and a sense amplifier enable signal sense_enable, for controlling the VBB oscillator 12, to thereby halt the VBB pumpers 15_1~15_4 when a sense amplifier operates, but applies a signal detecting the VBB to the VBB oscillator 12, when the sense amplifier does not operate.

Figure 4:
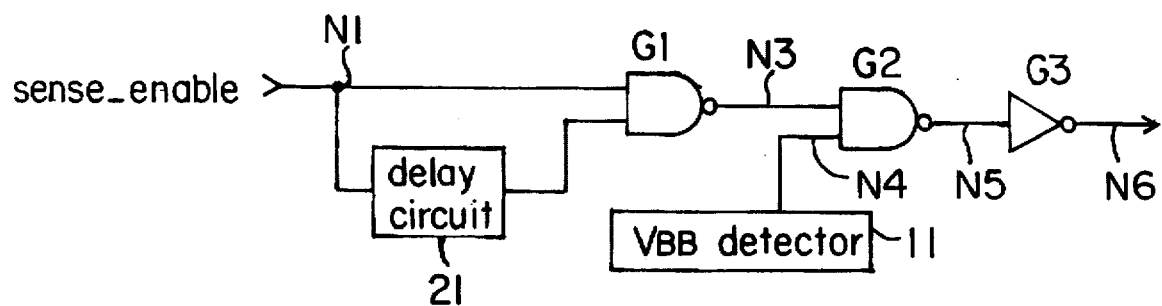
FIG. 4 is a circuit diagram illustrating a back bias voltage enable controller of FIG. 3.

FIG. 4 is a circuit diagram illustrating the VBB enable controller 20 of FIG. 3. In the circuit, there is a node N1 which inputs the sense amplifier enable signal sense_enable, a delay circuit 21 which delays the signal outputted from the node N1 for a predetermined time and then outputs the delayed signal to a node N2, a NAND gate G1 which NANDs the signals on the nodes N1 and N2 to output the NANDed result to a node N3; a node N4 which inputs an output signal of a VBB detector 11 for detecting a VBB potential signal; a NAND gate G2 which NANDs the signals on the nodes N3 and N4 to output the NANDed result to a node N5; and an inverter G3 which inverts the signal of the node N5 and outputs the inverted signal to a node N6.

In the operation, the sense amplifier enable signal sense_enable inputted to the node N1 is delayed by the delay circuit 21 and is outputted as a predetermined pulse signal, which is then outputted to the node N3 by means of the NAND gate G1. The predetermined pulse signal is outputted to the node N6 as a pulse signal having a predetermined pulse width by an output signal of a logic "high" level from the VBB detector 11. At the time, a pulse interval of a predetermined width among the pulse signals outputted to the node N6 is comprised of an interval where the sense amplifier senses data. Accordingly, in case of the pulse interval where the sense amplifier senses data, the operation of the VBB oscillator 12 is controlled to thereby halt the operation of the VBB pumpers 15_1~15_4. Therefore, when the sense amplifier senses data, the back bias voltage generating circuit does not operate, and thus the generation of noise on the substrate can be completely suppressed, thereby lowering an offset voltage of the sense amplifier.

Figure 5:
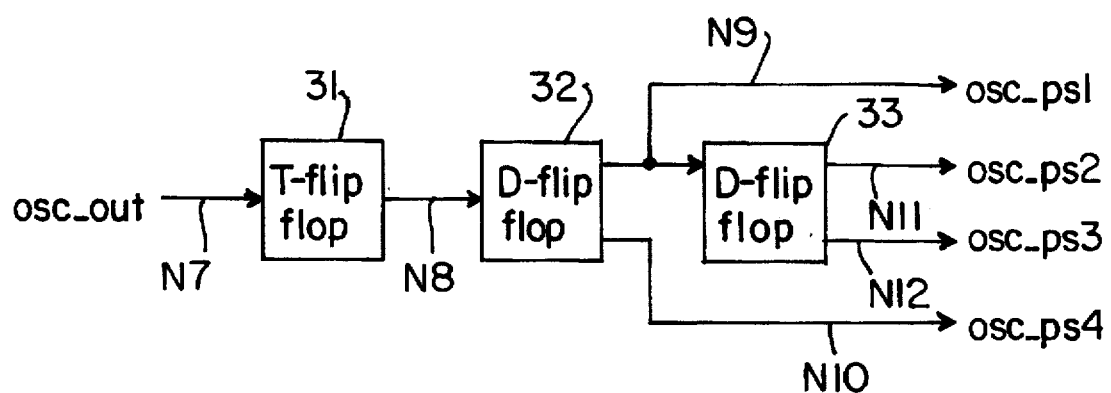
FIG. 5 is a circuit diagram illustrating a back bias voltage oscillator phase shifter of FIG. 3.

FIG. 5 is a circuit diagram illustrating the VBB oscillator phase shifter 30 of FIG. 3. The VBB oscillator phase shifter 30 is comprised of: a T flip-flop 31 which changes the pulse signal osc_out outputted from the VBB oscillator 12 to have a double period to thereby output the changed pulse signal osc out to a node N8; a first D flip-flop 32 which phase-shifts the signal of the node N8 outputted from the T flip-flop 31 by a ¼ period to thereby output the phase-shifted signal to a node N9 and outputs an inversion signal of the node N9 to a node N10; and a second D flip-flop 33 which phase-shifts the signal outputted from the node N9 by a ¼ period to thereby output the phase-shifted signal to a node N11 and outputs an inversion signal of the node N11 to a node N12.

In the operation, the VBB oscillator phase shifter 30 inputs the pulse signal osc_out outputted from the VBB oscillator 12 to the T flip-flop 31 where the period of pulse signal is doubled. Then, the first D flip-flop 32 phase-shifts the pulse signal osc_out by the ¼ period and outputs the phase-shifted signal osc_ps1 via the node N9 to the second D flip-flop 33. Also, the first D flip-flop 32 outputs the inversion signal osc_ps4 of the node N9 through the node N10. Further, the second D flip-flop 33 once phase-shifts the signal inputted from the node N9 by the ¼ period to output the phase-shifted signal osc_ps2 to the node N11. In addition, the second D flip-flop 33 outputs the inversion signal osc_ps3 of the node N11 through the node N12. The output signals osc_ps1~osc_ps4 to the nodes N9~N11 within the VBB oscillator phase shifter 30 are respectively inputted to the VBB pump drivers 14_1~14_4 to drive the VBB pumpers 15_1~15_4.

Figure 6:
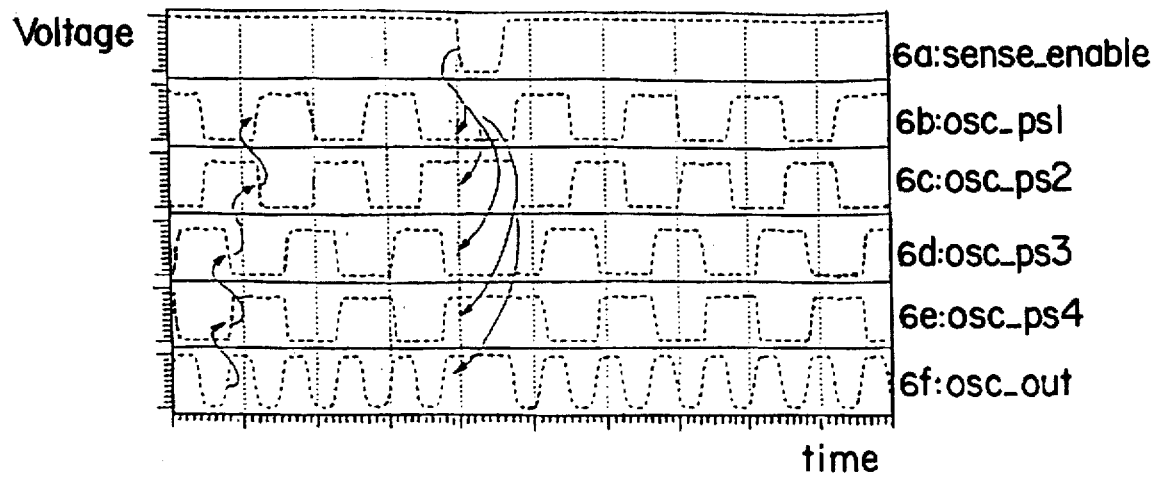
FIG. 6 is a timing diagram illustrating operational waveforms of the back bias voltage generating circuit of FIG. 3.

FIG. 6 is a timing diagram illustrating operational waveforms of the phase-shifted output signals osc_ps1~osc_ps4 of the VBB oscillator phase shifter 30. In the figure, a waveform "6a" represents the sense amplifier enable signal sense_enable, waveforms "6b, 6c, 6d and 6e" the phase-shifted output signals osc_ps1~osc_ps4 of the VBB oscillator phase shifter 30, and a waveform "6f" an output signal of the VBB oscillator 12.

The phase-shifted signals osc_ps1 and osc_ps2 generate opposite noise to each other in a power supply voltage Vcc, a ground voltage Vss and a substrate voltage VBB, so that the whole noise level becomes lowered.

The VBB oscillator phase shifter 30 phase-shifts the pulse signal by the ¼ and ½ periods from the VBB oscillator 12 and outputs the phase-shifted signals to the VBB pump drivers 14_1~14_4 respectively, thereby driving the VBB pumpers 15_1~15_4. This renders the noises generated on the power line, e.g., the power supply voltage Vcc and the ground voltage Vss and the substrate superposed on each other, to prevent a peak noise value from being increased.

Accordingly, the back bias voltage generating circuit according to the first embodiment of the present invention as shown in FIG. 3 can eliminate the noise generated on the substrate due to the operation of the back bias voltage generating circuit, when the sense amplifier senses data. Moreover, even when a general operation is executed, the noise level can be reduced, and the performance of the circuit can be maintained.

Figure 7:
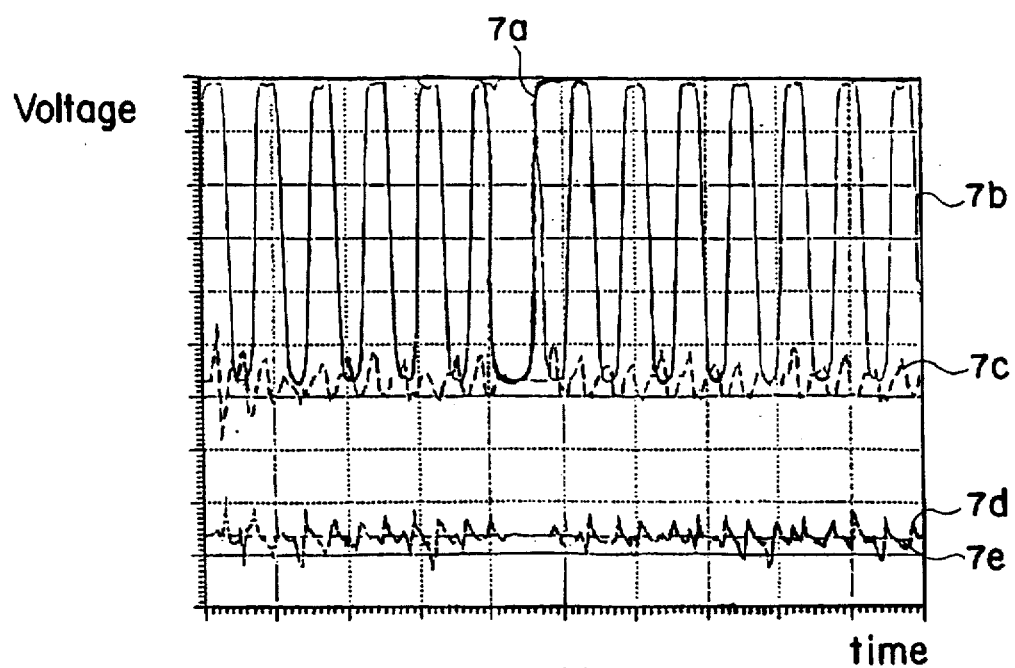
FIG. 7 is a graph illustrating a simulation result of noise waveforms generated from the back bias voltage generating circuit of FIG. 3.

FIG. 7 is a graph illustrating a simulation result of noise waveforms generated from the back bias voltage generating circuit of FIG. 3. In the figure, a waveform "7a" indicates an waveform of the sense amplifier enable signal sense_enable, a waveform "7b" represents an output waveform of the VBB oscillator 12, a waveform "7c" represents a noise component produced in the ground voltage Vss, a waveform "7d" represents a noise component produced in the substrate in case where the sense amplifier senses data, and a waveform "7e" represents a waveform of a VBB direct current voltage level. When the operation of the VBB pumpers 15_1~15_4 is stopped by the sense amplifier enable signal sense enable, as shown by the waveform "7a", the noise level as shown by the waveform "7d" generated in the substrate is very similar to the VBB direct current voltage level as shown by the waveform "7e".

Figure 8:
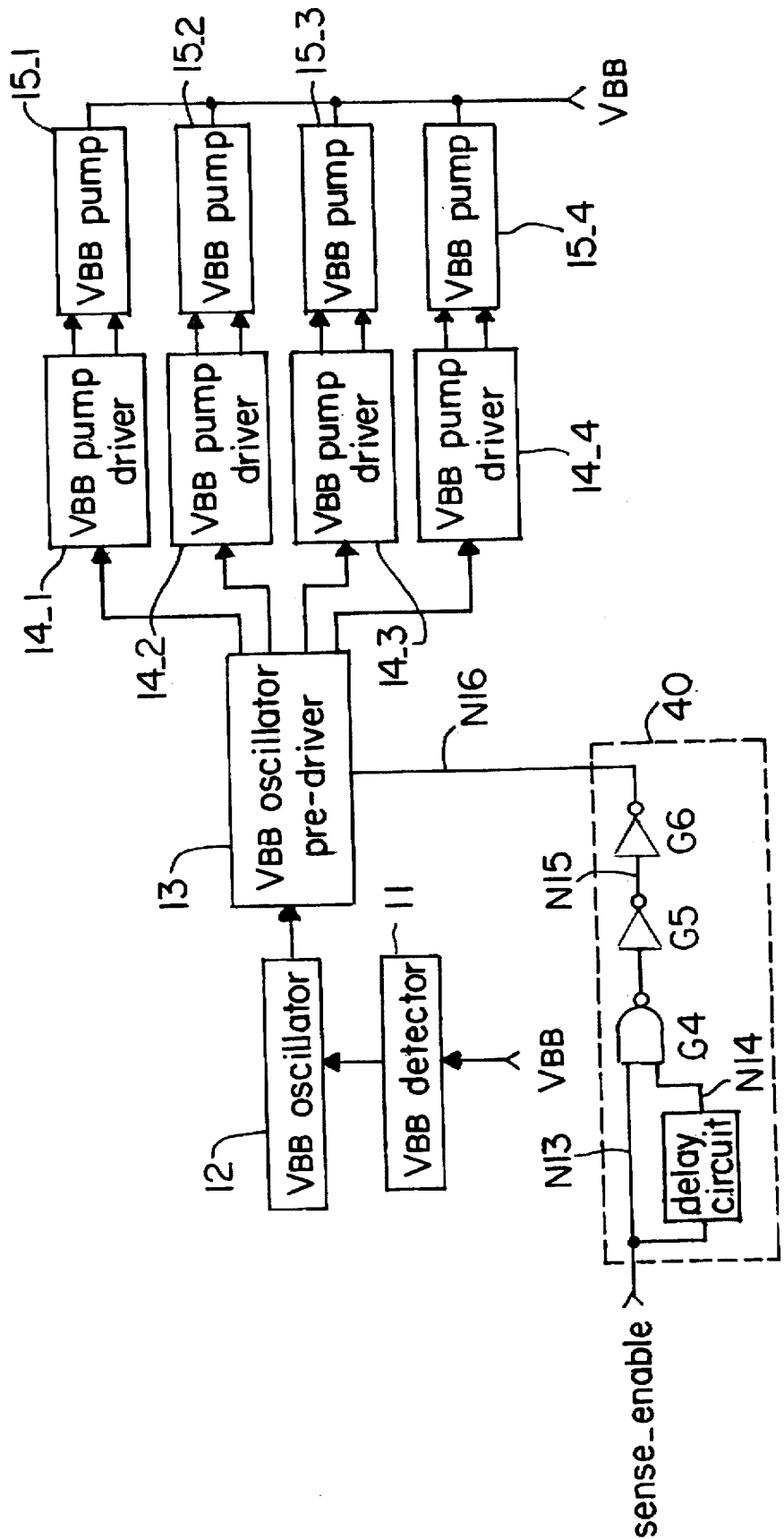
FIG. 8 is a block diagram illustrating a configuration of a back bias voltage generating circuit according to a second embodiment of the present invention.

FIG. 8 is a block diagram illustrating a configuration of a back bias voltage generating circuit according to a second embodiment of the present invention. In the configuration, there is provided a VBB detector 11 which detects a VBB; a VBB oscillator 12 which outputs a pulse signal having a constant period by an output of the VBB detector 11; a VBB enable controller 40 which inputs a sense amplifier enable signal sense enable to thereby output a predetermined pulse signal; a VBB oscillator phase shifter 30 which is controlled by the pulse signal generated from the VBB enable controller 40 and phase-shifts the pulse signal from the VBB oscillator 12 to thereby output a plurality of phase-shifted pulse signals; a plurality of VBB pump drivers 14_1~14_4 which are driven by the plurality of phase-shifted pulse signals outputted from the VBB oscillator phase shifter 30; and a plurality of VBB pumpers 15_1~15_4 which generate the VBB by control signals generated from the plurality of VBB pump drivers 14_1~14_4.

The VBB enable controller 40 is comprised of a delay circuit 41 for receiving the sense amplifier enable signal sense_enable, a NAND gate G4 for receiving the sense amplifier enable signal sense_enable and an output signal of the delay circuit 41, and inverters G5 and G6 serial-connected to the output terminal of the NAND gate G4.

The back bias voltage enable controller 40 is driven by the sense amplifier enable signal sense_enable to generate a predetermined pulse signal. The pulse signal is inputted to the VBB oscillator phase shifter 30 to halt the operation of VBB oscillator 12, resulting in the control of VBB pumpers 15_1~15_4.

In the same manner as the first embodiment of the present invention as shown in FIG. 3, the back bias voltage generating circuit as shown in FIG. 8 can stop the operation thereof by the sense amplifier enable signal when the sense amplifier senses data, to thus reduce the noise generated on the substrate.

As discussed above, a back bias voltage generating circuit according to the present invention can suppress generation of noise on the substrate when a sense amplifier senses data, so that an open bit line cell array structure can be constructed to improve the integration of the DRAM. Moreover, the back bias voltage generating circuit can shift the phase of pulse signal driving back bias voltage pumpers and prevent noise generated during the operation from being superposed, thereby reducing a peak noise value generated on a power line and substrate. Additionally, the back bias voltage generating circuit is capable of offsetting noise generated during the operation and noise generated on the power line and substrate using an inversion signal of the pulse signal outputted from a ring oscillator, so that the generated noise can be considerably reduced.

It will be apparent to those skilled in the art that various modifications and variations can be made in a back bias voltage generating circuit of a semiconductor memory device of the present invention without departing from the spirit or scope of the invention. Thus, it is intended that the present invention cover the modifications and variations of this invention provided they come within the scope of the appended claims and their equivalents.

What is claimed is:

1. A back bias voltage generating circuit of a semiconductor memory device, comprising:

a back bias voltage oscillator for outputting a pulse signal having a constant period;

a back bias voltage oscillator phase shifter for phase-shifting the pulse signal from said back bias voltage oscillator and for outputting a plurality of phase-shifted pulse signals;

a plurality of back bias voltage pump drivers driven by the plurality of phase-shifted pulse signals outputted from said back bias voltage oscillator phase shifter;

a plurality of back bias voltage pumpers for generating a back bias voltage by control signals generated from said plurality of back bias voltage pump drivers; and a back bias voltage enable controller for inputting said back bias voltage and a sense amplifier enable signal for controlling said back bias voltage oscillator, to thereby halt said back bias voltage pumpers, when a sense amplifier operates, but applies a signal detecting said back bias voltage to said back bias voltage oscillator, when the sense amplifier does not operate.

2. The back bias voltage generating circuit as claimed in claim 1, wherein said back bias voltage enable controller is comprised of:

a back bias voltage detector for detecting a back bias potential signal;

a delay circuit for delaying said sense amplifier enable signal for a predetermined time;

a first NAND gate for receiving said sense amplifier enable signal and an output signal of said delay circuit;

a second NAND gate for receiving an output signal of said first NAND gate and an output signal of said back bias voltage detector; and an inverter for inverting an output signal of said second NAND gate to output an back bias voltage enable signal.

3. The back bias voltage generating circuit as claimed in claim 1, wherein said back bias voltage oscillator phase shifter is comprised of:

a first flip-flop for changing the pulse signal outputted from said back bias voltage oscillator to have a double period to thereby output the changed pulse signal;

a second flip-flop for phase-shifting the pulse signal from said first flip-flop by a ¼ period to thereby output the phase-shifted signal; and a third flip-flop for phase-shifting the phase-shifted signal outputted from said second flip-flop by a ¼ period to thereby output the phase-shifted signal.

4. The back bias voltage generating circuit as claimed in claim 3, wherein said first flip-flop is comprised of a T flip-flop.

5. The back bias voltage generating circuit as claimed in claim 4, wherein said second and third flip-flops are comprised of a D flip-flop.

6. A back bias voltage generating circuit of a semiconductor memory device, comprising:

a back bias voltage detector for detecting a back bias voltage;

a back bias voltage oscillator for outputting a pulse signal having a constant period by an output of said back bias voltage detector;

a back bias voltage enable controller for inputting a sense amplifier enable signal to thereby output a predetermined pulse signal;

a back bias voltage oscillator phase shifter controlled by the predetermined pulse signal generated from said back bias voltage enable controller and for phase-shifting the pulse signal from said back bias voltage oscillator to thereby output a plurality of phase-shifted pulse signals;

a plurality of back bias voltage pump drivers driven by the plurality of phase-shifted pulse signals outputted from said back bias voltage oscillator phase shifter; and a plurality of back bias voltage pumpers for generating said back bias voltage by control signals generated from said plurality of back bias voltage pump drivers.

7. The back bias voltage generating circuit as claimed in claim 6, wherein said back bias voltage enable controller is comprised of:

a delay circuit for delaying said sense amplifier enable signal for a predetermined time; and a NAND gate for receiving said sense amplifier enable signal and an output signal of said delay circuit.

8. The back bias voltage generating circuit as claimed in claim 7, further comprising a first inverter for receiving an output signal of said NAND gate and a second inverter for receiving an output signal of said first inverter.

9. The back bias voltage generating circuit as claimed in claim 6, wherein said back bias voltage oscillator phase shifter is comprised of:

a first flip-flop for changing the pulse signal outputted from said back bias voltage oscillator to have a double period to thereby output the changed pulse signal;

a second flip-flop for phase-shifting the pulse signal from said first flip-flop by a ¼ period to thereby output the phase-shifted signal; and a third flip-flop for phase-shifting the phase-shifted signal outputted from said second flip-flop by a ¼ period to thereby output the phase-shifted signal.

10. The back bias voltage generating circuit as claimed in claim 9, wherein said first flip-flop is comprised of a T flip-flop.

11. The back bias voltage generating circuit as claimed in claim 10, wherein said second and third flip-flops are comprised of a D flip-flop.

* * * * *